(12) United States Patent
Petousis et al.

(10) Patent No.: US 11,449,771 B2
(45) Date of Patent: Sep. 20, 2022

(54) SYSTEMS AND METHODS FOR PROCESSING VEHICLE DATA

(71) Applicant: Renovo Motors, Inc., Campbell, CA (US)

(72) Inventors: Ioannis Petousis, Campbell, CA (US); Anand Ramesh, Campbell, CA (US); Christopher Heiser, Campbell, CA (US)

(73) Assignee: Woven Planet North America, Inc., Los Altos, CA (US)

( * ) Notice: Subject to any disclaimer, the term of this patent is extended or adjusted under 35 U.S.C. 154(b) by 455 days.

(21) Appl. No.: 16/578,810

(22) Filed: Sep. 23, 2019

(65) Prior Publication Data

US 2020/0097841 A1 Mar. 26, 2020

Related U.S. Application Data

(60) Provisional application No. 62/734,499, filed on Sep. 21, 2018.

(51) Int. Cl.
| | |
|---|---|
| *G06N 99/00* | (2019.01) |
| *G06N 5/04* | (2006.01) |
| *H03M 7/30* | (2006.01) |
| *G07C 5/00* | (2006.01) |
| *G06N 20/00* | (2019.01) |
| *G06N 3/04* | (2006.01) |
| *H04N 19/136* | (2014.01) |
| *H04N 19/162* | (2014.01) |

(52) U.S. Cl.
CPC ............... *G06N 5/04* (2013.01); *G06N 20/00* (2019.01); *G07C 5/008* (2013.01); *H03M 7/30* (2013.01); *G06N 3/04* (2013.01); *H04N 19/136* (2014.11); *H04N 19/162* (2014.11)

(58) Field of Classification Search
CPC . G06N 5/04; G06N 20/00; G06N 3/04; G07C 5/008; H03M 7/30; H04N 19/136; H04N 19/162
See application file for complete search history.

(56) References Cited

U.S. PATENT DOCUMENTS

2022/0053195 A1 * 2/2022 Hurwitz ............... G06K 9/6256

* cited by examiner

*Primary Examiner* — Joseph J Lauture
(74) *Attorney, Agent, or Firm* — Christopher G. Darrow; Darrow Mustafa PC

(57) ABSTRACT

Systems and methods include accessing streams of sensor data; constructing a corpus of seed sample data; initializing a first instance of a trained model using the corpus of seed sample data that: generates predictions of predicted sensor values; computing error values based on calculated differences between the actual sensor values and the predicted sensor values; transmitting the computed error values; initializing a second instance of the trained model based on an input of the corpus of the seed sample data, wherein the second instance of the trained model is identical to the first instance of the trained model, and wherein the second instance: generates inferences of predicted sensor values for each of the sensors based on the input of the corpus of seed sample data; reconstructing estimates of the actual sensor values based on a reconstruction computation with the parallel predicted sensor values and the error values.

18 Claims, 3 Drawing Sheets

200

Receiving Sensor Data S210

Implementing 1st ML Unit S220

Predicting Data Using 1st ML Unit S230

Implementing 2nd ML Unit S240

Predicting Data Using 2nd ML Unit S250

Calculating Error S260

Transmitting Error S270

Analyzing Error S280

SYSTEMS AND METHODS FOR PROCESSING VEHICLE DATA

CROSS-REFERENCE TO RELATED APPLICATIONS

This application claims the benefit of U.S. Provisional Application No. 62/734,499, filed 21 Sep. 2018, which is incorporated in its entirety by this reference.

TECHNICAL FIELD

This invention relates generally to the autonomous vehicle field, and more specifically to new and useful systems and methods for processing and transmitting data generated by vehicle.

BACKGROUND

Vehicles can be equipped with many sensors to enable operation and data collection from the circumstances (e.g., surroundings and operations) of the vehicle. These sensors typically collect vast quantities of data continuously or nearly-continuously as the vehicle is operating, under human control, or a combination of both. The vehicles are also typically connected to a network (e.g., the Internet or mobile broadband network) by one or more uplinks of varying types and possess some amount of onboard storage. These networks typically lack the bandwidth capacity or capability to uplink all the data collected by the sensors of the vehicles in real-time or near real-time, and while onboard storage of the collected data may theoretically be possible, to store all collected raw data onboard the vehicles may be financially infeasible. This can result in real-time data loss and degradation, as well as the inability to recall lost data for future use.

Further, vehicles often generate additional data based on the data collected by the sensors as well as from the basic operations of the vehicle. In remote management and/or operation of the vehicle, it is required that the entirety (or most) of the data including sensor data and vehicle generated data are transmitted to a disparate and/or remote entity via the one or more uplinks. The transmission of this vast amount of data often places a significant strain on the computing and transmission resources of the vehicle, as transmission of the vehicle data must be continuously compressed and transmitted through the available networks of the vehicle. Further, the bandwidth required for continuous transmission of data from autonomous vehicles would pose a very significant burden on existing mobile broadband networks. Additionally, because the bandwidth required for such transmissions is great, it is costly in terms of price paid per megabit used during transmission of the vehicle data to the remote entity.

Thus, there is a need in the autonomous vehicle field to create new and useful systems and methods for processing and transmitting vehicle data. The embodiments of the present application provide such new and useful systems and methods.

SUMMARY

In one embodiment, a system for machine learning-enhanced compression of data includes a first computing entity that: accesses one or more streams of sensor data, wherein the one or more streams of sensor data include actual sensor values generated by one or more sensors of the first computing entity; constructs a corpus of seed sample data based on a data sampling of the one or more streams of sensor data; initializes a first instance of a trained machine learning model based on an input of the corpus of seed sample data from the one or more streams of sensor data, wherein the first instance of the trained machine learning model: generates predictions of predicted sensor values for each of the one or more sensors based on the input of the corpus of seed sample data; computes error values based on calculated differences between the actual sensor values and the predicted sensor values; transmits the computed error values to a second computing entity that is geographically remote from the first computing entity; the second computing entity: initializes a second instance of the trained machine learning model based on an input of the corpus of the seed sample data from the one or more streams of sensor data, wherein the second instance of the trained machine learning model is identical to the first instance of the trained machine learning model, and wherein the second instance of the trained machine learning model: generates inferences of predicted sensor values for each of the one or more sensors based on the input of the corpus of seed sample data; reconstructs estimates of the actual sensor values based on a reconstruction computation with the parallel predicted sensor values and the error values from the first computing entity.

In one embodiment, the first computing entity comprises one of an autonomous vehicle, a semi-autonomous vehicle, and a manual vehicle, and the second computing entity comprises a network of distributed computing systems.

In one embodiment, the first computing entity comprises a plurality of onboard sensors, and the first computing entity implements a distinctly trained machine learning model for each of the plurality of onboard sensors.

In one embodiment, in parallel timing with the first computing entity, the second computing entity initializes the second instance of the trained machine learning model based on the input of the corpus of the seed sample data.

In one embodiment, at runtime: each of the one or more sensors operates to generate the one or more streams of sensor data, and the first computing entity continuously provides a corpus of trailing sensor data as machine learning input to the first instance of the trained machine learning model based on the one or more streams of sensor data, wherein the corpus of trailing sensor data includes predetermined amount of most recent in time sensor data gathered from the one or more streams of sensor data.

In one embodiment, the corpus of seed samples includes an initial sequence of data of a predetermined amount collected from each of the one or more data streams, and at runtime, the corpus of seed samples is fed as machine learning input to the first instance of the trained machine learning model.

In one embodiment, in response to reconstructing the estimate of the actual sensor values, the second computing entity replaces the predicted sensor values with the estimate of the actual sensor values.

In one embodiment, the system stores in electronic association, (1) a copy of the first instance of the trained machine learning model, (2) a copy of the corpus of seed sample data, (3) and a copy of the computed error values.

In one embodiment, the system includes a model training system that: during an initial training phase, trains one or more machine learning algorithms of the trained machine learning model with inputs of a plurality of data streams of a plurality of distinct sensors of the first computing entity; based on the initial training phase, identifies a subset of the plurality of data streams for retraining the one or more machine learning algorithms; and retrains the one or more machine learning algorithms if one or more efficacy metrics of the trained machine learning model satisfy or exceed an accuracy threshold based on the retraining.

In one embodiment, the system includes: if the error values exceed or satisfy an error threshold, a model training system that retrains: the first instance of the trained machine learning model using machine learning inputs of the one or more streams of sensor data of the first computing entity, and the second instance of the trained machine learning model using machine learning inputs of the estimates of the actual sensor values that were reconstructed by the second computing entity.

In one embodiment, the system includes: if the error values exceed or satisfy an error threshold, a model training system that retrains: the first instance of the trained machine learning model of the first computing entity and the second instance of the trained machine learning model using machine learning inputs of the one or more streams of sensor data of the first computing entity.

In one embodiment, the system operates in a lossy transmission mode, the first computing entity: assess an absolute value of each computed error value to an error threshold, and selectively transmits the computed error values that satisfy or exceed the error threshold and does not transmit the computed error values that do not satisfy or exceed the error threshold.

In one embodiment, the system operates in a lossy transmission mode, the first computing entity: integrates computed error values of adjacent areas of sensor data, assess the integrated computed error value to an integration error threshold, and selectively transmits the computed error values that satisfy or exceed the integration error threshold and does not transmit the computed error values that do not satisfy or exceed the integration error threshold.

In one embodiment, a method for machine learning-enhanced compression of data includes: at a first computing entity: accessing one or more streams of sensor data, wherein the one or more streams of sensor data include actual sensor values generated by one or more sensors of the first computing entity; constructing a corpus of seed sample data based on a data sampling of the one or more streams of sensor data; initializing a first instance of a trained machine learning model based on an input of the corpus of seed sample data from the one or more streams of sensor data, wherein the first instance of the trained machine learning model: generates predictions of predicted sensor values for each of the one or more sensors based on the input of the corpus of seed sample data; computing error values based on calculated differences between the actual sensor values and the predicted sensor values; transmitting the computed error values to a second computing entity that is geographically remote from the first computing entity; the second computing entity: initializing a second instance of the trained machine learning model based on an input of the corpus of the seed sample data from the one or more streams of sensor data, wherein the second instance of the trained machine learning model is identical to the first instance of the trained machine learning model, and wherein the second instance of the trained machine learning model: generates inferences of predicted sensor values for each of the one or more sensors based on the input of the corpus of seed sample data; reconstructing estimates of the actual sensor values based on a reconstruction computation with the parallel predicted sensor values and the error values from the first computing entity.

In one embodiment, the first computing entity comprises one of an autonomous vehicle, a semi-autonomous vehicle, and a manual vehicle, and the second computing entity comprises a network of distributed computing systems.

In one embodiment, the initialization of the first instance of the trained machine learning model and the initialization of the second instance of the trained machine learning model based on the input of the corpus of the seed sample data are performed simultaneously.

In one embodiment, a system for machine learning-enhanced compression of data from a vehicle to a remote network of distributed computing systems includes: a vehicle that: accesses one or more streams of sensor data, wherein the one or more streams of sensor data include original sensor values generated by one or more sensors of the vehicle; constructs a corpus of seed sample data based on a data sampling of the one or more streams of sensor data; initializes a first instance of a trained machine learning model based on an input of the corpus of seed sample data from the one or more streams of sensor data, wherein the first instance of the trained machine learning model: generates predictions of predicted sensor values for each of the one or more sensors based on the input of the corpus of seed sample data; computes error values based on calculated differences between the original sensor values and the predicted sensor values; transmits the computed error values to a remote network of distributed computing systems that is geographically remote from the vehicle; the remote network of distributed computing systems: initializes a second instance of the trained machine learning model based on an input of the corpus of the seed sample data from the one or more streams of sensor data, wherein the second instance of the trained machine learning model is identical to the first instance of the trained machine learning model, and wherein the second instance of the trained machine learning model: generates inferences of predicted sensor values for each of the one or more sensors based on the input of the corpus of seed sample data; reconstructs estimates of the original sensor values based on a reconstruction computation with the parallel predicted sensor values and the error values from the vehicle.

In one embodiment, the initialization of the first instance of the trained machine learning model and the initialization of the second instance of the trained machine learning model based on the input of the corpus of the seed sample data are performed simultaneously.

DESCRIPTION OF THE PREFERRED EMBODIMENTS

Figure 1:
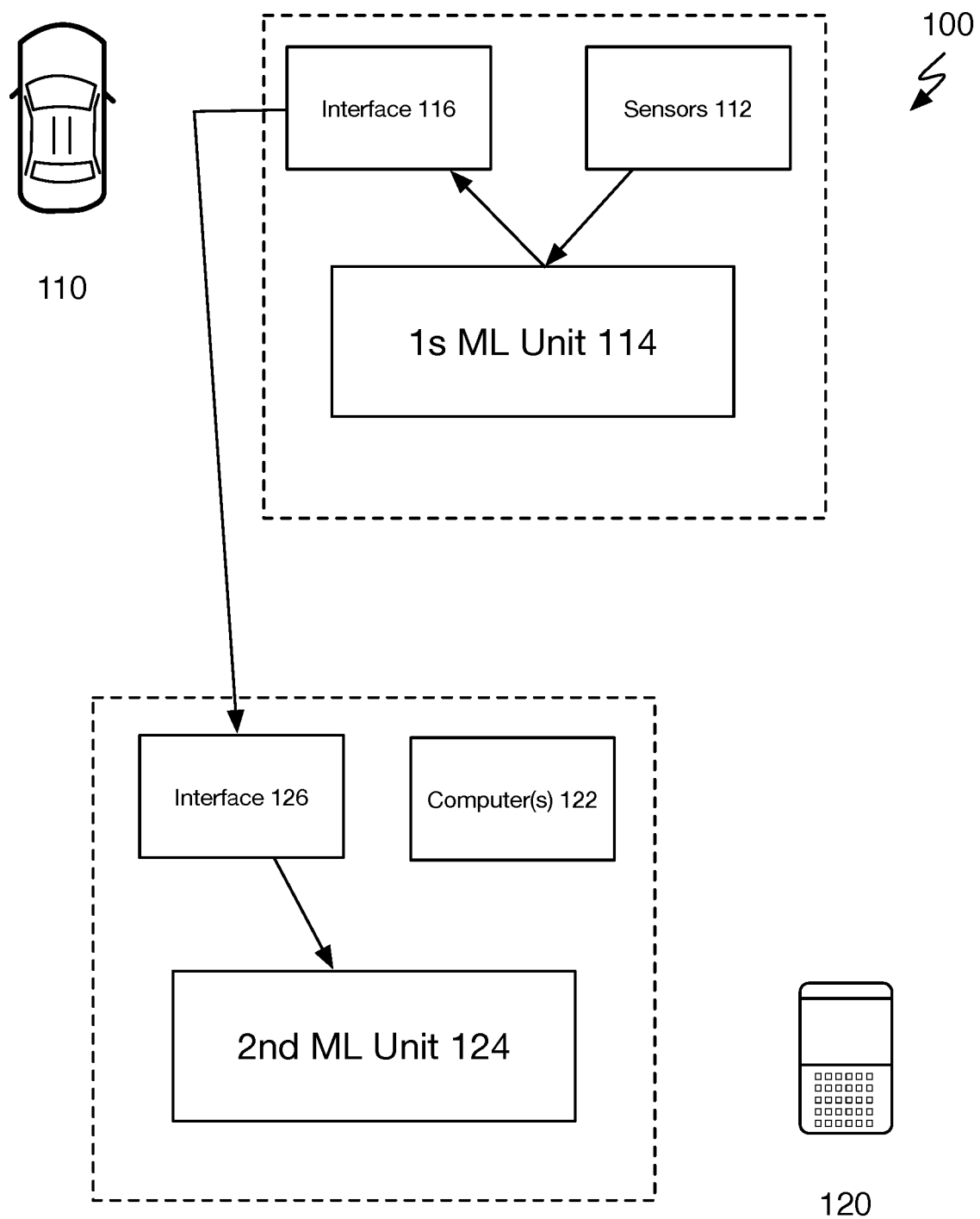
FIG. 1 illustrates an example system 100 in accordance with one or more embodiments of the present application.

The following description of the preferred embodiments of the present application are not intended to limit the inventions to these preferred embodiments, but rather to enable any person skilled in the art to make and use these inventions.

Overview

The inventors of the present application have discovered that components of autonomous vehicles (e.g., sensors, computing systems, navigation systems, etc.) cooperatively generate too much data during a driving session to practically transfer (e.g., economically, physically limited, etc.) to remote systems over conventional communication infrastructure. That is, in many cases, the data being generated by an autonomous vehicle may be so great that it is infeasible or impractical to transfer the generated data over the existing mobile infrastructure. For instance, autonomous vehicles operating at scale (e.g., with large numbers of active AVs), terrestrial or related communication networks may also experience significant duress resulting from a volume of raw data generated by transmission of data by the active autonomous vehicles on primary communication networks.

Accordingly, at least one objective of the present application is to minimize bandwidth usage when transferring data streams from the vehicle to a remote computing platform or the like. The embodiments of the present application provide novel technical solutions for achieving this objective, and in particular, the novel technical solutions greatly minimize the amount of data that needs to be transferred thereby reducing the bandwidth requirements for transmitting data from the vehicle to a remote platform. Specifically, embodiments of the present application provide intelligent compression techniques that selectively compress vehicle sensor data (or any data generating component of the vehicle) and the like based on implementing one or more machine learning models employed at the vehicle, as well as at the remote platform. The machine learning models at both the vehicle and the remote platform may be trained to emulate or predict vehicle sensor values or data of the vehicle sensors and possibly, other data generating components of the vehicle. The machine learning models employed at the vehicle and remote platform may be identical so that identical (in training and input) predicted vehicle sensor values are generated. Resultantly, the intelligent compression technique employed by the embodiments of the present application allow for a determination of error between the predicted vehicle sensor values at the vehicle and the actual vehicle sensor values and preferably, a lossless transmission of the calculated error values to the remote platform for correction of the predicted values produced using the machine learning model of the remote platform. Implementation of, at least, this technique significantly reduces the vehicle sensor data transmission load of the vehicle.

Additionally, the algorithm or design of the machine learning model may be specifically developed and trained to predict the output of a particular type of sensor (e.g., temperature sensor, camera, etc.) or data generating component. Additionally, or alternatively, the machine learning model may be specifically developed and trained to predict the output of a particular type of sensor operating in a particular environment, a certain location (e.g., city), particular weather, a specific device (e.g., mobile phone, a wearable computing device, etc.), etc. Further, the machine learning model may be situationally trained or designed to operate in any type of situation (e.g., while vehicle is driving in the city versus the highway). It shall be understood that the identical machine learning models may be implemented between any two or more devices for predicting varying types of data and in any circumstance or situation.

Accordingly, the embodiments of the present application may be used to perform compression of data streams using machine learning. The method involves training a machine learning model (which could be anything from deep learning neural networks to linear regression) and using the trained model on the device (e.g. car) where compression needs to happen (which could be different to the device where the model was trained). The model attempts to predict the value of the message (its actual value or the change in value) at time t based on its value at times t−n (where n>=1 and n is an integer) and also, (if required) based on the value of other sensors at times t−m (where this time m>=0 and m is an integer). The only requirement is that messages used in the input will have to be transmitted or stored (preferably losslessly) so that the decoder has access to the messages used in the input for use as input at the decoder. The prediction for time t is compared to the actual value of the message at time t and only the errors (subject to a minimum error value threshold if necessary) are transmitted (or stored). Different kinds of error functions can be used for determining or classifying error. On the decoder side (e.g., cloud) an exact copy of the same machine learning algorithm (same weights, coefficients, etc.) runs and as it has access to the same input data used by the machine learning algorithm at the device (encoder side), this machine learning algorithm generates the same prediction for the message at time t as in the encoder side. Thus, given the error values, it is able to reconstruct the original message by simple addition or any suitable reconstructive process. In essence, using standard compression language, the machine learning model (which is shared between the car and the cloud) becomes the encoder/decoder and the transmitted errors represent the encoded message.

While the embodiment described above impliedly predicts or estimates data values based on extrapolation, the machine learning models described in the embodiments herein may use any data calculation technique including interpolation, extrapolation, and/or a combination thereof.

For instance, in one implementation, the compression method implements a buffer at the encoder (e.g., the vehicle) that stores data from one or more sensors and the like. The compression implements identical machine learning models at the encoder and decoder (e.g., remote computing platform) that function to interpolate (e.g., predict) data values between known (actual data values) sensor values in the buffer. It shall be known that more than one buffer may be used and data from any combination of the buffers may be used as input for making predictions.

As an example of the above implementation, on the encoder side, a buffer operating for some predetermined time (e.g., one minute) may buffer five data points. Data points d1, d3, and d5 from the buffer may be used as input into the machine learning model of the encoder to predict/interpolate data points d2 and d4. The error between the predicted values and the actual data values at the encoder may be calculated. Additionally, and/or separately, data points d2 and d4 from the buffer may be used as input into the machine learning model of the encoder to predict/interpolate data point d3. Error between predicted d3 and actual d3 may be calculated.

An analysis of the error may produce an indication that the error for predicted data points d3 and d4 was zero while the prediction for predicted data point d2 include some error amount. As a result, the encoder may only transmit to the decoder actual data points d1 and d5 and the error for predicted data point d2. This message from the encoder without any further data or insight may indicate to the decoder that it is capable of predicting/interpolating data points d3 and d4 without error using the data points provided in the message from the encoder. The decoder implementing the same prediction/interpolation sequence or processes as the encoder using data points d1 and d5 as well as error for d2 as input functions to reconstruct the data values for d2-d4, which match the data values for d2-d4 in the data buffer at the encoder.

This implementation of involving the buffer may be optimized to achieve various computing resource conservation including achieving maximum compression ratio to reduce bandwidth usage or to achieve minimal computational power/time to reduce energy usage and the like. For example, in one variation of the implementation involving a buffer, the encoder may selectively choose to fully transmit an actual data point d1, predict d2 based on d1, predict d3 based on d1 and d2, fully transmit actual data point d5, predict d6 based on d1-d3 and d5, and predict d4 based on d1-d3 and d5-d6. The prediction sequence implemented by the encoder may be stored and/or transmitted with the message including the fully transmitted data points d1 and d5 for the benefit of the decoder. Alternatively, if the sequence used by the encoder is a predetermined sequence available or accessible by the decoder, the transmission of the message may simply include an indication of the sequence used or an identifier associated with the predetermined sequence. Additionally, or alternatively, sensor fusion may also be used in such implementation.

This compression method can be lossless or lossy and can be applied to time-series, LiDAR, RADAR, camera data or any other data stream that varies in time or even non-time series data. While this compression method is well-suited for well-defined repetitive streams of data (e.g., like the video from a dashboard camera or the like), it can also be implemented for use with general data streams and may be applied to any data series, as well. If the compression method is in lossless mode, all error values are transmitted. If the compression method is in lossy mode, only certain errors are transmitted. The compression mode (e.g., lossless or lossy) of the compression method may be based on various factors including the type of device data generated, requirements (e.g., data quality) at the remote platform, an amount (e.g., small or large) of error calculated, and the like. For instance, when the compression method constantly detects small error between the predicted and actual values, it is less likely that a lossless mode of transmission is required for correcting the predicted values at the remote platform. In this regard, the compression method may implement a lossy mode of transmission for constant small error and most likely, implement a lossless mode of transmission when large error values are computed.

Additionally, the compression method may not send all calculated errors. One way of choosing which errors to transmit is by setting a threshold value which is then compared to the absolute value of the error. Another way would be by integrating the errors of adjacent areas (e.g., pixels) and transmitting the areas whose integral is larger than a threshold value. However, as mentioned above, any type of error function can be used including an autoencoder or other machine learning model that learns a reduced representation of the errors.

A problem with lossy compression in some cases, is that decoding depends on other compressed data or previously compressed data and hence, it is possible that errors accumulate gradually degrading the performance of the compressor. This problem can be solved by having checkpoints, i.e. occasionally transmitting (storing) either all errors (lossless mode) or transmitting (storing) the actual message in any other lossless manner. This would allow for a total and accurate correction, in the case of transmitting all errors in lossless mode or allow for re-initializing the machine learning algorithm at the remote entity when the actual values from the device are transmitted in a lossless manner to the remote entity. Additionally, or alternatively, the errors that will be transmitted (whether in lossless mode or a lossy mode) can be further compressed using regular (lossless or lossy) compression techniques (e.g., entropic compression, zip compression, autoencoders, etc.).

In the case of images, the compression algorithm described above can be applied to the complete picture, or part of the picture only (e.g. after background has been removed) or even a specific object of interest (e.g. a specific car or a specific pedestrian). Additionally, or alternatively, the partial application of the compression algorithm can be applied to any type of captured or generated data including three-dimensional renderings and the like.

1. System for Intelligent Compression and Transmission of Data

As shown in FIG. 1, the system 100 includes a vehicle 110 including a plurality of sensors 112, a first machine learning unit 114, and a communication interface 116, and a remote computing platform 120 including one or more computers and/or servers 122, a second machine learning unit 124, and a communication interface 126.

The system 100 functions to implement a first machine learning unit 114 at the vehicle 110 and a second machine learning unit 124 at the remote computing platform 120. The first machine learning unit 114 and the second machine learning unit 124 of system 100 preferably implement the same machine learning algorithm for predicting values or data that may be produced by one or more of the plurality of sensors 112 at the vehicle 110. In the system 100, the vehicle 110 may be in operable communication via a network connection established between the communication interface 116 of the vehicle 110 and the communication interface 126 of the remote computing platform 120. The system 100 functions to implement a compression method, as described in more detail in methods 200 and 300, that reduce computation and transmission load and resultantly, bandwidth used in transmission of vehicle sensor data to the remote computing platform 120.

The vehicle 110 is preferably a fully autonomous automobile, but may additionally or alternatively be any semi-autonomous or fully autonomous vehicle; e.g., a boat, an unmanned aerial vehicle, a driverless car, etc. Additionally, or alternatively, the vehicle 110 may be a vehicle that switches between a semi-autonomous state and a fully autonomous state (or a fully-manned state) and thus, the vehicle 110 may have attributes of both a semi-autonomous vehicle and a fully autonomous vehicle depending on the state of the vehicle 110.

It shall be understood that while the present system 100 and several of the embodiments of the present application described herein implement an encoder via the vehicle 110 and a decoder via the remote computing platform 120, the inventions of the present application should not be limited to these exemplary systems for implementing the novel methods and techniques of the invention. For instance, it may be possible to implement various portions of the systems and methods of the disclosed inventions on any computing platform (e.g., servers, mobile computing devices, etc.). Thus, embodiments of the present application may extend beyond the context of vehicles and may be equally application in many other technological context, as noted above.

The first machine learning unit 114 and the second machine learning unit 124 may be implemented via one or more computer processors, including one or more CPUs and/or one or more GPUs or any suitable computer processing elements. Additionally, or alternatively, the system implementing the first machine learning unit 114 may be considered an encoder and the other system implementing the second machine learning unit 124 may be considered the decoder. In some embodiments, machine learning unit 114, 124 includes one or more of a local machine learning system (e.g., implemented in Python, R, etc.), a cloud-based machine learning client (e.g., an application communicatively coupled to a cloud-based machine learning system such as, for example, Microsoft Azure Machine Learning Service™, and the like). In some embodiments, either and/or both of the machine learning unit 114 and the machine learning unit 124 may be constructed or designed to perform one or more of: supervised learning (e.g., using logistic regression, back propagation neural networks, random forests, decision trees, etc.), unsupervised learning (e.g., using an Apriori algorithm, k-means clustering, etc.), semi-supervised learning, reinforcement learning (e.g., using a Q-learning algorithm, temporal difference learning, etc.), and any other suitable learning style. Each model of the ensemble of machine learning models of the unit 114 and/or the unit 124 may implement any one or more of: a regression algorithm (e.g., ordinary least squares, logistic regression, stepwise regression, multivariate adaptive regression splines, locally estimated scatterplot smoothing, etc.), an instance-based method (e.g., k-nearest neighbor, learning vector quantization, self-organizing map, etc.), a regularization method (e.g., ridge regression, least absolute shrinkage and selection operator, elastic net, etc.), a decision tree learning method (e.g., classification and regression tree, iterative dichotomiser 3, C4-5, chi-squared automatic interaction detection, decision stump, random forest, multivariate adaptive regression splines, gradient boosting machines, etc.), a Bayesian method (e.g., naïve Bayes, averaged one-dependence estimators, Bayesian belief network, etc.), a kernel method (e.g., a support vector machine, a radial basis function, a linear discriminant analysis, etc.), a clustering method (e.g., k-means clustering, expectation maximization, etc.), an associated rule learning algorithm (e.g., an Apriori algorithm, an Eclat algorithm, etc.), an artificial neural network model (e.g., a Perceptron method, a back-propagation method, a Hopfield network method, a self-organizing map method, a learning vector quantization method, etc.), a deep learning algorithm (e.g., a restricted Boltzmann machine, a deep belief network method, a convolutional network method, a stacked auto-encoder method, etc.), a dimensionality reduction method (e.g., principal component analysis, partial lest squares regression, Sammon mapping, multidimensional scaling, projection pursuit, etc.), an ensemble method (e.g., boosting, bootstrapped aggregation, AdaBoost, stacked generalization, gradient boosting machine method, random forest method, etc.), and any suitable form of machine learning algorithm. At least one processing portion of the unit 114, 124 can additionally or alternatively leverage: a probabilistic module, heuristic module, deterministic module, or any other suitable module leveraging any other suitable computation method, machine learning method or combination thereof. However, any suitable machine learning approach can otherwise be incorporated in the system 100.

All or some of the processes described herein are preferably performed by a vehicle system in cooperation with a remote computing system (e.g., a distributed network of computers or the like), but can alternatively be performed entirely by the remote computing system, the vehicle system, or any other suitable system. The vehicle system is preferably onboard the vehicle (e.g., a vehicle computer integrated with the vehicle), but can additionally or alternatively be decoupled from the vehicle (e.g., a mobile device within the vehicle). The vehicle system includes a processing system (e.g., graphical processing unit or GPU, central processing unit or CPU) as well as memory. The memory can be short term (e.g., volatile, non-volatile, random access memory or RAM, etc.) and/or long term (e.g., flash memory, hard disk, etc.) memory. The vehicle system can also include a wireless communication system (e.g., Wi-Fi, Bluetooth, cellular 3G, cellular 4G, cellular 5G, multiple-input multiple-output or MIMO, one or more radios, or any other suitable wireless communication system or protocol), a wired communication system (e.g., modulated powerline data transfer, Ethernet, or any other suitable wired data communication system or protocol), sensors, and/or a data transfer bus (e.g., CAN, FlexRay). The remote computing system can include a user device (e.g., a mobile phone, a laptop, etc.), a remote server, a cloud server, or any other suitable local and/or distributed computing system remote from the vehicle. The remote computing system is preferably connected to the vehicle system through one or more data connections (e.g., channels), but can alternatively communicate with the vehicle system in any suitable manner.

One or more instances of the method and/or processes described herein can be performed asynchronously (e.g., sequentially), concurrently (e.g., in parallel), or in any other suitable order and/or using one or more instances of the systems, elements, and/or entities described herein.

Receiving vehicle sensor data functions to receive data for subsequent processing, packaging, compression, transmission, and any other blocks of the method. The vehicle sensor data is preferably received through wired connections between vehicle sensor(s) and the vehicle computing system (e.g., the CAN bus), but can additionally or alternatively be received over wireless connections, a combination of wireless and wired connections, or any other suitable connections.

Vehicle sensor data is preferably raw data collected from a sensor of the vehicle but can be any suitable form of data derived from vehicle sensors. Raw data shall be understood to mean data that is a lossless representation of all information collected by a sensor or sensors; accordingly, it may be in any suitable lossless format. Alternatively, the vehicle sensor data can be compressed, derived data (e.g., derivative messages based on sensor data), compounded or combined data (e.g., fused data from multiple sensors, point clouds, feature parameters, object parameters, detected gradients, changes between sequential image frames, errors between a predetermined data model and actual measured data, classification of a data type, detected anomalies above a baseline, etc.), compressed data (e.g., using lossless or lossy compression), data segments, or any other suitable data. Vehicle sensor data can additionally or alternatively be downsampled. Derivative (e.g., derived) data can be specified and/or determined based on a remote request (e.g., specified processing module is activated, and a processing method specified in the remote request is applied to vehicle sensor data to generate the derived data), based on predetermined rules (e.g., always determined, and then stored and/or discarded), based on an application or client (e.g., wherein an on-board or remote third-party application associated with the vehicle requests certain types of derivative data), or determined in any suitable manner.

Vehicle sensor data can originate from any suitable vehicle sensor (e.g., interior or exterior on-board sensors, external sensors, etc.). Such sensors include embedded sensors, GPS systems, LiDAR, radar, cameras, audio sensors, temperature sensors, pressure sensors, position sensors, velocity sensors, timers, clocks, and any other suitable sensors. The data can be of any suitable type, including, but not limited to: image data, audio data, one-dimensional data (e.g., voltage, current), multi-dimensional data (e.g., point cloud, heatmap, functional surface, other 2D or 3D data, etc.), and/or time series.

2. Method for Intelligent Compression and Transmission of Data

Figure 2:
FIG. 2 illustrates a method 200 in accordance with one or more embodiments of the present application.

As shown in FIG. 2, the method 200 includes: receiving (or collecting) vehicle sensor data S210, providing as input a subset of the vehicle sensor data into a first machine learning unit implementing a machine learning algorithm S220, predicting future values of vehicle sensor data by the first machine learning unit S230, providing as input a subset of the vehicle sensor data into a second machine learning unit at a remote computing platform S240, predicting future values of vehicle sensor data by the second machine learning unit at the remote computing platform (e.g., the cloud) S250, calculating error data between values of the predicted vehicle sensor data and the values of the actual vehicle sensor data S260, transmitting the error data to the remote computing platform and correcting the future values of vehicle sensor data predicted by the second machine learning unit using the error data S270. Optionally, the method 200 includes analyzing the error data and providing as input a new subset of vehicle sensor data to the second machine learning unit S280.

The method 200 may be implemented by system 100 or any variation or system described herein and functions to initialize a local machine learning unit (e.g., first machine learning unit) at a vehicle and a remote machine learning unit (e.g., second machine learning unit) to predict future or other (e.g., interpolation) data values of vehicle sensor data. It shall be noted that both the local machine learning unit at the vehicle and the remote machine learning unit are the exact same. That is, the local machine learning unit and the remote machine learning unit implement a same machine learning algorithm and receive the same inputs and thus, both machine learning units are capable of learning and predicting data the same.

The method 200 functions to use the predicted future values of the vehicle sensor data generated at the remote machine learning unit in the place of actual vehicle sensor data collected locally at a vehicle. In this way, the data transmission load of the vehicle to a remote computing platform is reduced and usage of bandwidth at the vehicle during compression and transmission of vehicle sensor data is maintained to a minimum value.

S210, which includes receiving (or collecting) vehicle sensor data, functions to obtain data from one or more of a plurality of sensors of the vehicle. The collected vehicle sensor data preferably includes data obtained during an observance of circumstances surrounding and involving an operation of the vehicle. As mentioned above, the vehicle sensor data may include any type of data that is observable by any device of the vehicle. In a preferred embodiment, the collected vehicle sensor data preferably includes data having large byte values relative to other data collectible by the vehicle sensors. For instance, two-dimensional data collected by a camera of an autonomous vehicle may be data having a large byte value relative to temperature sensor value collected by a heat sensor.

In one variation of S210, the collected vehicle data may also include data generated by the vehicle. In a typical operation of the vehicle, the vehicle may use various data collected by its sensors and/or provided via one or more data feeds to derive, infer, or generate alternate or new data. The alternate data may include insights derived from a dataset, renderings (e.g., 3-D renderings), and the like. In such case, three-dimensional renderings of circumstances surrounding the vehicle or the like may be considered data having a large byte value, such that it is preferable to use method 200 for providing a form (or small portion) of the data having the large byte to a remote computing platform rather than the actual data having the large byte value to mitigate the usage of bandwidth during transmission.

S220, which includes providing as input a subset of the vehicle sensor data into a first machine learning unit, functions to implement a first machine learning unit locally at a vehicle to generate an estimation or prediction of data values of an observable parameter relating to circumstances of the vehicle. The subset of vehicle sensor data may include data values from a single sensor (e.g., a temperature sensor) or data values from a combination of sensors (e.g., camera, pressure sensor, etc.). The generated prediction of the data values may be predicted and/or interpolated based on the known data points (e.g., historical data points, historically estimated data points, etc.) provided as input. In some embodiments, the predicted data values (e.g., predicted data values d6-d7) may be based on a combination of known (e.g., actual data points d1-d3) and predicted data values (e.g., predicted data points d4-d5).

The initial subset of data provided to the first machine learning unit as input may be referred to herein as a seed sample. The seed sample may be used to initialize (e.g., initial training) the machine learning unit and as the prediction of the machine learning unit advances, further data comprising trailing sample of data may be used as input for the machine learning unit. The trailing sample may include a sequence of data corresponding to data obtained from a vehicle sensor in a most recent time frame different from and later than the time frame of the seed sample.

In one variation, the initial subset of data may include previously or already compressed data and thus, the machine learning unit may function to make predictions based on already compressed (e.g., predicted data values) input data.

The subset of vehicle sensor data may correspond to sensor data from one or more specific sensors of the vehicle. For instance, the subset of vehicle sensor data may include data from a heat sensor and data from a pressure sensor (or a second heat sensor). The type of sensor data defining the subset of vehicle sensor data may be informed by the type of machine learning algorithm employed in the machine learning unit. In one example, the machine learning algorithm may be specifically designed for predicting temperature values from a temperature sensor of the vehicle. In this regard, the subset of data provided as input into the machine learning unit should be (but not limited to) temperature data collected by a temperature sensor of the vehicle. In addition, any other data that can help predict the temperature and that are also available on both the encoder and decoder side can be used (an example would be atmospheric humidity).

It shall be noted that a specific machine learning algorithm may be employed for predicting values of a specific type of sensor (e.g., temperature sensor), other data values or contextual data values may also be provided as input to the machine learning unit for improving the predictive capabilities of the machine learning unit. For instance, when predicting temperature values of a temperature sensor of the vehicle, other contextual data relating to the circumstances of the operation of the vehicle and values from other sensors of the vehicle (e.g., a sensor fusion) may better inform a prediction of temperature values by the machine learning unit. In such instance, contextual data, such as on/off state data of the vehicle, duration of operation of the vehicle, fluid level data, environmental conditions (e.g., weather), mode of operating the vehicle (e.g., aggressive, freeway, city, etc.), road conditions, traffic conditions, and the like may also be provided as sensor data input to improve the predictive abilities of the machine learning unit. Any contextual data about the operations or circumstances of the vehicle may be used as input by the machine learning unit for performing predictions of sensor values.

The method can include storing vehicle sensor data, which functions to retain vehicle sensor data in long term onboard storage for wired transmission or eventual wireless transmission. Storing vehicle sensor data can include receiving vehicle sensor data from one or more buffers into long term storage.

S230, which includes predicting future values of vehicle sensor data by the first machine learning unit, functions to ingest the vehicle sensor data provided as input and implementing the machine learning algorithm, the first machine learning unit functions to identify patterns of the (operations of) one or more vehicles sensors originating the data and/or patterns of the vehicle sensor data. Additionally, or alternatively, S230 using the identified patterns may function to build one or more models for predicting data from one or more of the vehicle sensors.

S230 may implement any suitable prediction technique for predicting the vehicle sensor data.

S250, which includes predicting future values of vehicle sensor data by the second machine learning unit at a remote computing platform (e.g., the cloud), functions to predict vehicle sensor data of one or more vehicle sensors in a same manner as described in S230 for the first machine learning unit at the vehicle.

In this regard, the prediction function of the second machine learning unit may be implemented using as prediction variables various observable data points obtained by the vehicle and/or data points generated by the vehicle. These observable and generated data points can include, but are not limited to, data points obtained or generated during a static state (e.g., ON state and not moving, OFF state and not moving, etc.) of the vehicle (e.g., idling values, etc.), data points obtained or generated during a dynamic state (e.g., ON state and moving, OFF state and moving, etc.) of the vehicle (e.g., velocity values, Rotations Per Minute (RPM) values, etc.), or any other state achievable a vehicle.

S240, which includes providing as input a subset of the vehicle sensor data into a second machine learning unit, functions to implement, at a remote computing platform, a second machine learning unit that is identical to the first machine learning unit and that also, implements the same machine learning algorithm as the first machine learning unit. S240 may be implemented in parallel (e.g., simultaneously) or synchronously with S220, such that both the first machine learning unit at the vehicle (e.g., encoder) and the second machine learning unit at the remote computing platform (e.g., decoder) may execute simultaneous (or near simultaneous) and/or real-time predictions of data values.

S240 includes transmitting, from the vehicle to the remote computing platform, the same subset of vehicle sensor data used to initialize the first machine learning unit. Additionally, or alternatively, S240 may include transmitting synchronization information, such as timer data or the like that may be used by both the first and second machine learning units to synchronize the processing and prediction of vehicle sensor data. Accordingly, in parallel (or contemporaneously) with the initialization and/or initial training of the first machine learning unit, the seed sample may be transmitted to the cloud (e.g., the remote computing platform) for initializing the second machine learning unit.

In one variation of S240, the seed samples to be used in initializing the first machine learning unit are firstly transmitted via a network or the like to the remote computing platform. Additionally, or alternatively, the transmission of the seed samples may include or be appended with synchronization data that may be used to synchronize the initialization of the first machine learning unit at the vehicle and the second machine learning at the remote computing platform. Thus, only after receiving the seed samples and possibly, the synchronization data, are the seed samples provided as input to both the first machine learning unit and the second machine learning unit, preferably in parallel based on the synchronization data. In this way, the remote computing platform is able to generate vehicle sensor prediction data at a same time or substantially a same time as the vehicle. This implementation allows for real-time processing of vehicle sensor data at the remote computing platform for trouble shooting, generating insights, and the like.

S260, which includes calculating error data between values of the predicted vehicle sensor data and the values of the actual vehicle sensor data, functions to determine error(s) between the predicted data values for vehicle sensor data generated at the first machine learning unit and a corresponding actual data value from the vehicle sensor. For example, S260 may function to calculate the error between each of the predicted vehicle sensor values and each of the actual vehicle sensors as follows: Actual-sensor value (A-$sv_n$) at a time (n, where n>0) subtracted by Predicted-sensor value (P-$sv_n$) at a time (n) [(A-$sv_n$)−(P-$sv_n$)]=Error (values or data). Error may be calculated using any suitable technique.

S260 may also function to store the error data locally on board the vehicle and in association or correspondence with parameters of the machine learning unit at the vehicle. In this way, recovery of the actual data stream (if not stored) for a vehicle sensor can be computed and thereby recovered by re-implementing the machine learning unit with the parameters associated with the stored error values.

Once error values are determined, S270, which includes transmitting the error data to the remote computing platform and correcting the future values of vehicle sensor data using the error data, functions to generate a lossless compression of the error data and transmit the error data to the remote computing platform. Additionally, or alternatively, S270 may include generating metadata describing or linking the predicted vehicle sensor value at the first machine learning unit to the corresponding calculated error value. The error metadata may be compressed separately in a less than lossless compression rate (e.g., lossy compression) and transmitted together with the error data.

S270 may include transmitting the calculated error data in a plurality of modes depending a variety of factors, such as calculated error amount, quality of values required at the remote computing platform for processing vehicle sensor data, and the like. Thus, S270 may include a transmission continuum including a lossless transmission mode, a semi-lossless transmission mode, and lossy transmission mode which may be selectively chosen based on one or more predetermined factors.

In a first implementation, S270 may function to perform transmissions of error data in a lossless mode. In such first implementation, S270 may function to transmit all computed error values or substantially all error values beyond a lossless threshold or the like.

In a second implementation, S270 may function to perform transmissions of error data in lossy mode. In such second implementation, S270 may function to transmit less than all errors or an amount of error values at or below a lossy threshold. Additionally, or alternatively, S270 may function to selectively determine which error values and/or an amount of error values to transmit based on a computation and/or comparison in which an absolute value of an error value may be compared to an error threshold. In the circumstance that the absolute value of a computed error value satisfies or exceeds the error threshold, S270 may function to selectively transmit the computed error value. In the circumstance that the absolute value of a computed error value does not satisfy or exceed the error threshold, S270 may function to skip a transmission of the computed error value.

In a variant of the second implementation, S270 may function to transmit errors in a lossy mode of transmission by integrating computed error values of adjacent areas (e.g., for pixels of an image or the like). In such variant, S270 may function to compare the computed error integral values to an integral error threshold and transmit the computed error values for adjacent areas whose error integral values satisfy or exceed the integral error threshold.

In some embodiments, if the vehicle sensor data and the predicted vehicle sensor data are represented as nonnumeric values (e.g., high, medium, low, etc.), the error calculation becomes a comparison of the nonnumeric values (rather than a calculation) of the prediction of the machine learning unit and the actual value of the vehicle sensor and when there is not a match between an actual sensor value at a time (n, where n>0) and a predicted sensor value at a time (n), S240 determines an error. In such cases, the error transmitted in step S270 to the remote computing platform may comprise the actual vehicle sensor data (and not a difference between the actual sensor data and the predicted sensor data) since a computational difference may not be possible to calculate.

Additionally, S270 further includes using the transmitted error in correction of the predicted vehicle sensor data at the second machine learning unit. In particular, using the metadata provided with the transmission of error data, S270 is able to correspond error data values to predicted vehicle sensor values of the machine learning unit. S270 may perform error correction in any suitable manner including by augmenting (e.g., adding) or diminishing (e.g., subtracting) a predicted vehicle sensor value by the error data value or in the case that the error data includes a nonnumeric error, substituting the predicted vehicle sensor value with the error data value.

S280, which includes analyzing the error data and providing as input a new subset of vehicle sensor data to the second machine learning unit, functions to periodically transmit to the remote computing platform a new subset of vehicle sensor data comprising a trailing sample of actual vehicle sensor data based on the analysis of the error data. The new subset of vehicle sensor data would be used as input to re-train the machine learning algorithm in order to reduce error of the machine algorithm's predicted values.

S280 may implement one or more error threshold that may dynamically trigger the transmission of the trailing sample to the remote computing platform. For instance, if an average of the calculated error for a sample of the predicted values at the first machine learning unit exceeds a predetermined error threshold, this may automatically trigger a transmission to the remote computing platform by the vehicle of a trailing sample of vehicle sensor data comprising a most recent in time vehicle sensor data values. In some embodiments, the error threshold may be dynamically adjusted (preferably to be lower) in view of the advancements in the training of the machine learning algorithm.

In one variation of the method 200, instead of a machine algorithm, the method 200 may implement any suitable algorithm or formula that is able to predict future values based on historical vehicle sensor data. For example, with respect to acceleration and speed, the remote computing platform may receive a sequence of acceleration values of the vehicle at known intervals, the speed of the vehicle can be predicted or calculated ($v(t2)=a*\delta t+v(t1)$). In such example, only error or deviations from the predicted values using the velocity equation should be transmitted to the remote computing platform.

Figure 3:
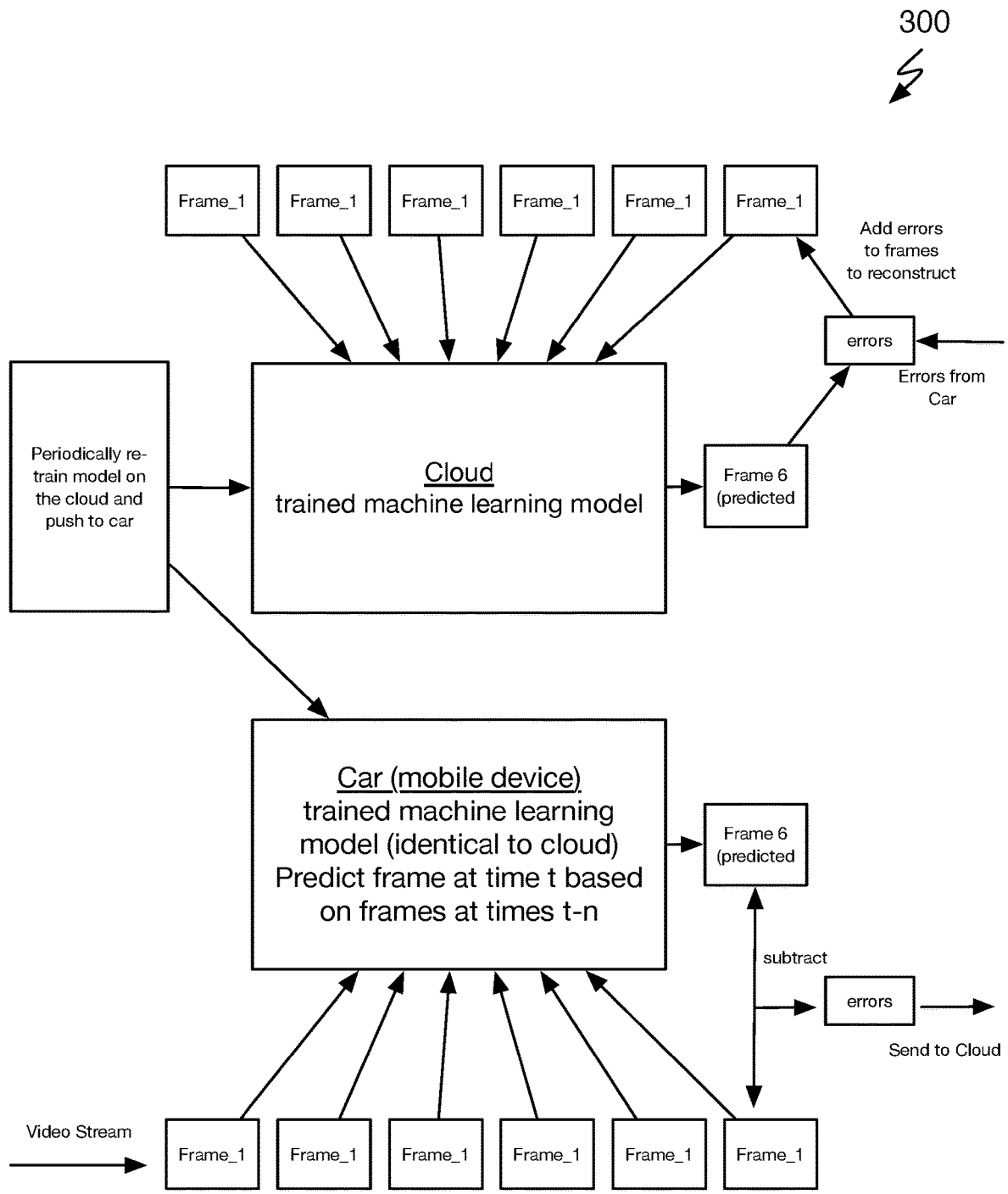
FIG. 3 illustrates a detail process flow of a method 300 in accordance with one or more embodiments of the present application.

As shown in FIG. 3, a schematic illustrating one embodiment of the present application comprising a mixed method and apparatus 300 is provided. The schematic 300 includes a device component (e.g., mobile device, vehicle, or the like) that includes a trained machined learning unit that is capable of making predictions, and another trained machine learning unit at the cloud. Both machine learning units are identical copies of one another—thus they have both received the exact same training. In this example, the trained machine learning units at the device and at the cloud are given as input a sample of video frames (e.g., Frame 1-Frame 5) to predict a future frame (Frame 6).

An error determination is made in schematic 300 based on finding a difference between the predicted value for Frame 6 and an actual value for Frame 6. The calculated error value is transmitted to the cloud, preferably in a lossless manner, and used to correct the predicted Frame 6 value of the machine learning unit at the cloud.

Each of the trained machine learning units may be re-trained periodically. The machine learning unit at the vehicle may be re-trained using trailing values for the actual video frame values obtained from a camera or other sensor of the vehicle, whereas the machine learning unit at the cloud may be re-trained using trailing values for the corrected frame values (e.g., predicted frames+error values). Additionally, or alternatively, in some embodiments, both machine learning units at the vehicle and at the cloud may be trained using as input third party data. The third-party data may be data from a manufacturer of one or more sensors of the vehicle, from third-party evaluators of one or more sensors of the vehicle, and the like. The third-party data may be any type or form of data that be used as input to enhance the predictive capabilities of the machine learning units and should not be limited to the examples described above.

It shall be noted that while the systems and methods of the present application are described as generally being implemented between a vehicle and a remote cloud service or the like, the systems and methods herein may be implemented between any two disparate computing devices at which one of the two computing devices generates original data values and associated predictions (using any prediction technique) of data values and the other computing device only generates predictions of data values.

The system and methods of the preferred embodiment and variations thereof can be embodied and/or implemented at least in part as a machine configured to receive a computer-readable medium storing computer-readable instructions. The instructions are preferably executed by computer-executable components preferably integrated with the system and one or more portions of the processors and/or the controllers. The computer-readable medium can be stored on any suitable computer-readable media such as RAMs, ROMs, flash memory, EEPROMs, optical devices (CD or DVD), hard drives, floppy drives, or any suitable device. The computer-executable component is preferably a general or application specific processor, but any suitable dedicated hardware or hardware/firmware combination device can alternatively or additionally execute the instructions.

Although omitted for conciseness, the preferred embodiments include every combination and permutation of the various system components and the various method processes.

As a person skilled in the art will recognize from the previous detailed description and from the figures and claims, modifications and changes can be made to the preferred embodiments of the invention without departing from the scope of this invention defined in the following claims.

What is claimed is:

1. A system for machine learning-enhanced compression of data, the system comprising:
   a first computing entity that:
      accesses one or more streams of sensor data, wherein the one or more streams of sensor data include actual sensor values generated by one or more sensors of the first computing entity;
      constructs a corpus of seed sample data based on a data sampling of the one or more streams of sensor data;
      initializes a first instance of a trained machine learning model based on an input of the corpus of seed sample data from the one or more streams of sensor data, wherein the first instance of the trained machine learning model:
         generates predictions of predicted sensor values for each of the one or more sensors based on the input of the corpus of seed sample data;
         computes error values based on calculated differences between the actual sensor values and the predicted sensor values;
         transmits the computed error values to a second computing entity that is geographically remote from the first computing entity;
   the second computing entity:
      initializes a second instance of the trained machine learning model based on an input of the corpus of the seed sample data from the one or more streams of sensor data, wherein the second instance of the trained machine learning model is identical to the first instance of the trained machine learning model, and wherein the second instance of the trained machine learning model:
         generates inferences of predicted sensor values for each of the one or more sensors based on the input of the corpus of seed sample data;
         reconstructs estimates of the actual sensor values based on a reconstruction computation with the predicted sensor values and the error values from the first computing entity.

2. The system according to claim 1, wherein:
   the first computing entity comprises one of an autonomous vehicle, a semi-autonomous vehicle, and a manual vehicle, and
   the second computing entity comprises a network of distributed computing systems.

3. The system according to claim 1, wherein:
   the first computing entity comprises a plurality of onboard sensors, and
   the first computing entity implements a distinctly trained machine learning model for each of the plurality of onboard sensors.

4. The system according to claim 1, wherein:
   in parallel timing with the first computing entity, the second computing entity initializes the second instance of the trained machine learning model based on the input of the corpus of the seed sample data.

5. The system according to claim 1, wherein:
   at runtime:
      each of the one or more sensors operates to generate the one or more streams of sensor data, and
      the first computing entity continuously provides a corpus of trailing sensor data as machine learning input to the first instance of the trained machine learning model based on the one or more streams of sensor data, wherein the corpus of trailing sensor data includes predetermined amount of most recent in time sensor data gathered from the one or more streams of sensor data.

6. The system according to claim 1, wherein:
   the corpus of the seed sample data includes an initial sequence of data of a predetermined amount collected from each of the one or more streams of data, and
   at runtime, the corpus of seed sample data is fed as machine learning input to the first instance of the trained machine learning model.

7. The system according to claim 1, wherein:
   in response to reconstructing the estimate of the actual sensor values, the second computing entity replaces the predicted sensor values with the estimate of the actual sensor values.

8. The system according to claim 1, wherein:
   the first computing entity stores in electronic association, (1) a copy of the first instance of the trained machine learning model, (2) a copy of the corpus of seed sample data, (3) and a copy of the computed error values.

9. The system according to claim 1, further comprising:
   a model training system that:
      during an initial training phase, trains one or more machine learning algorithms of the trained machine learning model with inputs of a plurality of data streams of a plurality of distinct sensors of the first computing entity;
      based on the initial training phase, identifies a subset of the plurality of data streams for retraining the one or more machine learning algorithms; and
      retrains the one or more machine learning algorithms if one or more efficacy metrics of the trained machine learning model satisfy or exceed an accuracy threshold based on the retraining.

10. The system according to claim 1, further comprising:
    if the error values exceed or satisfy an error threshold, a model training system that retrains:
       the first instance of the trained machine learning model using machine learning inputs of the one or more streams of sensor data of the first computing entity, and
       the second instance of the trained machine learning model using machine learning inputs of the estimates of the actual sensor values that were reconstructed by the second computing entity.

11. The system according to claim 1, further comprising:
    if the error values exceed or satisfy an error threshold, a model training system that retrains:
       the first instance of the trained machine learning model of the first computing entity and the second instance of the trained machine learning model using machine learning inputs of the one or more streams of sensor data of the first computing entity.

12. The system according to claim 1, wherein:
the system operates in a lossy transmission mode, the first computing entity:
  assess an absolute value of each computed error value to an error threshold, and
  selectively transmits the computed error values that satisfy or exceed the error threshold and does not transmit the computed error values that do not satisfy or exceed the error threshold.

13. The system according to claim 1, wherein:
the system operates in a lossy transmission mode, the first computing entity:
  integrates computed error values of adjacent areas of sensor data,
  assesses the integrated computed error value to an integration error threshold, and
  selectively transmits the computed error values that satisfy or exceed the integration error threshold and does not transmit the computed error values that do not satisfy or exceed the integration error threshold.

14. A method for machine learning-enhanced compression of data, the method comprising:
at a first computing entity:
  accessing one or more streams of sensor data, wherein the one or more streams of sensor data include actual sensor values generated by one or more sensors of the first computing entity;
  constructing a corpus of seed sample data based on a data sampling of the one or more streams of sensor data;
  initializing a first instance of a trained machine learning model based on an input of the corpus of seed sample data from the one or more streams of sensor data, wherein the first instance of the trained machine learning model:
    generates predictions of predicted sensor values for each of the one or more sensors based on the input of the corpus of seed sample data;
  computing error values based on calculated differences between the actual sensor values and the predicted sensor values;
  transmitting the computed error values to a second computing entity that is geographically remote from the first computing entity;
the second computing entity:
  initializing a second instance of the trained machine learning model based on an input of the corpus of the seed sample data from the one or more streams of sensor data, wherein the second instance of the trained machine learning model is identical to the first instance of the trained machine learning model, and wherein the second instance of the trained machine learning model:
    generates inferences of predicted sensor values for each of the one or more sensors based on the input of the corpus of seed sample data;
  reconstructing estimates of the actual sensor values based on a reconstruction computation with the predicted sensor values and the error values from the first computing entity.

15. The method according to claim 14, wherein:
the first computing entity comprises one of an autonomous vehicle, a semi-autonomous vehicle, and a manual vehicle, and
the second computing entity comprises a network of distributed computing systems.

16. The method according to claim 14, wherein:
initializing the first instance of the trained machine learning model and initializing the second instance of the trained machine learning model based on the input of the corpus of the seed sample data are performed simultaneously.

17. A system for machine learning-enhanced compression of data from a vehicle to a remote network of distributed computing systems, the system comprising:
a vehicle that:
  accesses one or more streams of sensor data, wherein the one or more streams of sensor data include original sensor values generated by one or more sensors of the vehicle;
  constructs a corpus of seed sample data based on a data sampling of the one or more streams of sensor data;
  initializes a first instance of a trained machine learning model based on an input of the corpus of seed sample data from the one or more streams of sensor data, wherein the first instance of the trained machine learning model:
    generates predictions of predicted sensor values for each of the one or more sensors based on the input of the corpus of seed sample data;
  computes error values based on calculated differences between the original sensor values and the predicted sensor values;
  transmits the computed error values to a remote network of distributed computing systems that is geographically remote from the vehicle;
the remote network of distributed computing systems:
  initializes a second instance of the trained machine learning model based on an input of the corpus of the seed sample data from the one or more streams of sensor data, wherein the second instance of the trained machine learning model is identical to the first instance of the trained machine learning model, and wherein the second instance of the trained machine learning model:
    generates inferences of predicted sensor values for each of the one or more sensors based on the input of the corpus of seed sample data;
  reconstructs estimates of the original sensor values based on a reconstruction computation with the predicted sensor values and the error values from the vehicle.

18. The system according to claim 17, wherein:
the initialization of the first instance of the trained machine learning model and the initialization of the second instance of the trained machine learning model based on the input of the corpus of the seed sample data are performed simultaneously.

* * * * *